US010389310B2

(12) United States Patent
Nakajima et al.

(10) Patent No.: US 10,389,310 B2
(45) Date of Patent: Aug. 20, 2019

(54) RADIO-FREQUENCY SIGNAL AMPLIFIER CIRCUIT, POWER AMPLIFIER MODULE, FRONT-END CIRCUIT, AND COMMUNICATION DEVICE

(71) Applicant: Murata Manufacturing Co., Ltd., Kyoto (JP)

(72) Inventors: Reiji Nakajima, Kyoto (JP); Hidenori Obiya, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/145,430

(22) Filed: Sep. 28, 2018

(65) Prior Publication Data

US 2019/0036488 A1 Jan. 31, 2019

Related U.S. Application Data

(63) Continuation of application No. PCT/JP2017/009630, filed on Mar. 9, 2017.

(30) Foreign Application Priority Data

Mar. 30, 2016 (JP) .................. 2016-069268

(51) Int. Cl.
*H03F 1/12* (2006.01)
*H03F 1/26* (2006.01)
(Continued)

(52) U.S. Cl.
CPC .............. *H03F 1/12* (2013.01); *H03F 1/26* (2013.01); *H03F 3/19* (2013.01); *H03F 3/193* (2013.01);
(Continued)

(58) Field of Classification Search
CPC ............ H03F 1/565; H03F 3/245; H03F 3/195
See application file for complete search history.

(56) References Cited

U.S. PATENT DOCUMENTS 7,773,956 B2 * 8/2010 Fukamachi .......... H04B 1/0057
333/132
7,885,613 B2 * 2/2011 Kemmochi ............ H04B 1/006
455/78
(Continued)

FOREIGN PATENT DOCUMENTS

JP H06-188643 A 7/1994
JP 2005-143079 A 6/2005
(Continued)

OTHER PUBLICATIONS

International Search Report for International Application No. PCT/JP2017/009630, dated Jun. 6, 2017.
(Continued)

*Primary Examiner* — Berhanu Tadese
(74) *Attorney, Agent, or Firm* — Pearne & Gordon LLP

(57) ABSTRACT

A radio-frequency signal amplifier circuit that is used in a front-end circuit and that propagates a radio-frequency transmission signal and a radio-frequency reception signal is described. The amplifier circuit has an amplifier transistor, a bias circuit, a resistor, and an LC series resonance circuit. The LC series resonant circuit has one end that is connected to a node between the resistor and a signal input terminal, and has another end that is connected to a grounding terminal. A resonant frequency of the LC series resonance circuit is included in a difference frequency band between the frequencies of the transmission signal and the reception signal.

15 Claims, 7 Drawing Sheets

(51) Int. Cl.
- *H03F 3/19* (2006.01)
- *H03F 3/24* (2006.01)
- *H03F 3/193* (2006.01)
- *H04B 1/525* (2015.01)

(52) U.S. Cl.
CPC .............. *H03F 3/24* (2013.01); *H03F 3/245* (2013.01); *H04B 1/525* (2013.01); *H03F 2200/21* (2013.01); *H03F 2200/222* (2013.01); *H03F 2200/243* (2013.01); *H03F 2200/318* (2013.01); *H03F 2200/451* (2013.01); *H03F 2203/21103* (2013.01); *H03F 2203/21127* (2013.01); *H03F 2203/21133* (2013.01)

(56) References Cited

U.S. PATENT DOCUMENTS

| | | | | |
|---|---|---|---|---|
| 8,058,945 B2* | 11/2011 | Wada | ........................ | H01P 1/36 333/1.1 |
| 8,315,577 B2* | 11/2012 | Kemmochi | ............ | H04B 1/006 455/78 |
| 8,614,601 B2* | 12/2013 | Ota | ........................ | H03F 1/0277 330/124 R |
| 8,618,884 B2* | 12/2013 | Yagasaki | ............... | H03F 1/3211 330/253 |
| 8,682,258 B2* | 3/2014 | Fukamachi | ............... | H04B 1/50 370/343 |
| 8,816,769 B2* | 8/2014 | Moreira | .................... | H03F 3/45 330/253 |
| 8,823,451 B2* | 9/2014 | Yagasaki | ............... | H03F 1/3211 330/253 |
| 9,099,964 B2* | 8/2015 | Yagasaki | ............... | H03F 1/3211 |
| 9,166,531 B2* | 10/2015 | Iijima | ................... | H03F 1/0261 |
| 9,264,011 B2* | 2/2016 | Ishizuka | .................. | H03H 7/38 |
| 9,270,236 B2* | 2/2016 | Watanabe | ............... | H03F 1/565 |
| 9,451,561 B2* | 9/2016 | Tanaka | ................. | H04B 1/0475 |
| 9,490,516 B2* | 11/2016 | Kato | ...................... | H01P 3/085 |
| 9,585,105 B2* | 2/2017 | Tanaka | ................. | H04B 1/0475 |
| 9,693,320 B2* | 6/2017 | Tanaka | ................. | H04B 1/0475 |
| 9,748,625 B2* | 8/2017 | Kato | ...................... | H01P 3/085 |
| 9,780,735 B1* | 10/2017 | Obiya | ..................... | H03F 1/26 |
| 9,807,703 B2* | 10/2017 | Tanaka | ................. | H04B 1/0475 |
| 9,955,435 B2* | 4/2018 | Tanaka | ................. | H04B 1/0475 |
| 10,079,417 B2* | 9/2018 | Kato | ...................... | H01P 3/085 |
| 10,116,348 B2* | 10/2018 | Obiya | ..................... | H04B 1/04 |
| 2005/0077964 A1 | 4/2005 | Maeda | | |
| 2008/0166980 A1* | 7/2008 | Fukamachi | ......... | H04B 1/0057 455/83 |
| 2008/0212552 A1* | 9/2008 | Fukamachi | ......... | H04B 1/0057 370/343 |
| 2009/0017772 A1* | 1/2009 | Kemmochi | ............ | H04B 1/006 455/73 |
| 2009/0315656 A1* | 12/2009 | Wada | ........................ | H01P 1/36 335/296 |
| 2012/0098606 A1* | 4/2012 | Yagasaki | ............... | H03F 1/3211 331/74 |
| 2013/0163212 A1 | 6/2013 | Tanaka et al. | | |
| 2013/0265111 A1* | 10/2013 | Ota | ........................ | H03F 1/0277 330/286 |
| 2014/0035669 A1* | 2/2014 | Moreira | .................... | H03F 3/45 330/253 |
| 2014/0062817 A1* | 3/2014 | Ishizuka | .................. | H03H 7/38 343/745 |
| 2014/0091862 A1* | 4/2014 | Yagasaki | ............... | H03F 1/3211 330/253 |
| 2014/0167856 A1* | 6/2014 | Takahashi | ............. | H03F 1/0277 330/295 |
| 2014/0167862 A1* | 6/2014 | Khatri | .................... | H02H 9/043 330/298 |
| 2014/0295781 A1 | 10/2014 | Kawano | | |
| 2014/0347130 A1* | 11/2014 | Iijima | ................... | H03F 1/0261 330/288 |
| 2014/0354359 A1* | 12/2014 | Yagasaki | ............... | H03F 1/3211 330/253 |
| 2015/0011256 A1* | 1/2015 | Tanaka | ................. | H04B 1/0475 455/552.1 |
| 2015/0070096 A1* | 3/2015 | Watanabe | ............... | H03F 1/565 330/296 |
| 2016/0112009 A1* | 4/2016 | Hitomi | ................... | H04B 1/525 455/127.2 |
| 2017/0271733 A1* | 9/2017 | Kato | ...................... | H01P 3/085 |
| 2017/0288614 A1* | 10/2017 | Obiya | ..................... | H03F 1/26 |
| 2017/0302328 A1* | 10/2017 | Obiya | ..................... | H04B 1/04 |
| 2018/0062587 A1* | 3/2018 | Nakajima | ............... | H01L 23/48 |
| 2018/0062591 A1* | 3/2018 | Nakajima | ............... | H01L 23/48 |
| 2018/0323756 A1* | 11/2018 | Sun | ........................ | H03F 3/217 |

FOREIGN PATENT DOCUMENTS

| | | | | |
|---|---|---|---|---|
| JP | 2013-110619 A | 6/2013 | | |
| JP | 2013-132015 A | 7/2013 | | |
| JP | 2014-204170 A | 10/2014 | | |
| JP | 2014236469 A | * 12/2014 | ............ | H03F 3/245 |
| JP | 2015-056734 A | 3/2015 | | |
| JP | 2015-231123 A | 12/2015 | | |
| WO | 2013/150564 A1 | 10/2013 | | |
| WO | 2014/087479 A1 | 6/2014 | | |
| WO | 2015/002127 A1 | 1/2015 | | |
| WO | WO-2016117482 A1 * | 7/2016 | ............... | H04B 1/04 |
| WO | WO-2017169645 A1 * | 10/2017 | ............ | H03F 3/245 |

OTHER PUBLICATIONS

Written Opinion for International Application No. PCT/JP2017/009630, dated Jun. 6, 2017.

\* cited by examiner

RADIO-FREQUENCY SIGNAL AMPLIFIER CIRCUIT, POWER AMPLIFIER MODULE, FRONT-END CIRCUIT, AND COMMUNICATION DEVICE

This is a continuation of International Application No. PCT/JP2017/009630 filed on Mar. 9, 2017 which claims priority from Japanese Patent Application No. 2016-069268 filed on Mar. 30, 2016. The contents of these applications are incorporated herein by reference in their entireties.

BACKGROUND

Technical Field

The present disclosure relates to a radio-frequency signal amplifier circuit, a power amplifier module, a front-end circuit, and a communication device.

Nowadays, a cellular phone is required to support a plurality of frequency bands (be a multi-band terminal). A multi-band front-end circuit is required to propagate transmission/reception signals in a plurality of frequency bands without degrading them. A radio-frequency power amplifier circuit for amplifying a transmission signal is therefore required to have high amplification performance to amplify a transmission signal while decreasing a receiving band noise level at the time of transmission.

Patent Document 1 discloses a radio-frequency power amplifier for suppressing out-of-band noise. FIG. 9 is a circuit block diagram of the radio-frequency power amplifier disclosed in Patent Document 1. The radio-frequency power amplifier illustrated in the drawing includes an RF input terminal 501, an RF output terminal 505, an input matching circuit 502, a radio-frequency signal amplifier transistor 503, an output matching circuit 504, a bias circuit 506, and a series resonance circuit 507. One end of the series resonance circuit 507 is connected between the radio-frequency signal amplifier transistor 503 and the bias circuit 506, and the other end of the series resonance circuit 507 is connected to the ground. The series resonance circuit 507 includes an inductor 508 and a capacitor 509. With this configuration, noise in a difference frequency band generated in the bias circuit 506 can be prevented from entering the radio-frequency signal amplifier transistor 503. As a result, out-of-band noise can be suppressed without the reduction in gain in a transmission band.

Patent Document 1: International Publication No. 2014/087479

BRIEF SUMMARY

In a radio-frequency power amplifier, an ideal power amplification operation is performed in a state where a voltage and a current are 180° out of phase with each other. However, in reality, a phase is further shifted from a state where the current lags the voltage by 180°. The series resonance circuit 507 disclosed in Patent Document 1 potentially has a function of complementing the above-described phase shift between the current and the voltage.

However, in the radio-frequency power amplifier disclosed in Patent Document 1, a radio-frequency transmission signal enters the bias circuit and oscillation easily occurs depending on the position of the series resonance circuit 507. The series resonance circuit 507 therefore cannot sufficiently adjust the phase shift between the current and the voltage. As a result, it is difficult to improve a saturated output and power-added efficiency.

The present disclosure provides a radio-frequency signal amplifier circuit, a power amplifier module, a front-end circuit, and a communication device in which a saturated output and power-added efficiency are improved while out-of-band noise is stably suppressed.

A radio-frequency signal amplifier circuit according to an embodiment of the present disclosure is used in a front-end circuit configured to propagate a radio-frequency transmission signal and a radio-frequency reception signal. The radio-frequency signal amplifier circuit includes an amplifier transistor configured to amplify the radio-frequency transmission signal, a bias circuit configured to supply a bias to a signal input terminal of the amplifier transistor, a first resistance element having one end connected to the bias circuit and the other end connected to the signal input terminal, and an induction-capacitance (LC) series resonance circuit that has one end connected to a node between the first resistance element and the signal input terminal and the other end connected to a grounding terminal and includes an inductor and a capacitor that are connected in series to each other. A resonant frequency of the LC series resonance circuit is included in a difference frequency band between the radio-frequency transmission signal and the radio-frequency reception signal.

With the above-described configuration in which the first resistance element is connected between the signal input terminal of the amplifier transistor and the bias circuit, a radio-frequency signal can be prevented from entering the bias circuit and the occurrence of oscillation at an amplification path can be prevented. That is, a damping effect can be provided, and an amplification operation can therefore be stabilized. The LC series resonance circuit having the function of complementing the phase shift between a current and a voltage at the amplification path is connected in shut between the first resistance element and the amplifier transistor. Accordingly, the phase shift of a radio-frequency transmission signal can be complemented without necessarily the attenuation of the radio-frequency transmission signal in the first resistance element. As a result, a radio-frequency reception signal component generated by mixing the radio-frequency transmission signal and a difference frequency band component in the bias circuit and the amplifier transistor can be suppressed. In addition, the saturated output and power-added efficiency of a radio-frequency transmission signal can be improved while out-of-band noise is stable suppressed.

The LC series resonance circuit may further include, between the node and the grounding terminal, a second resistance element connected in series to the inductor and the capacitor.

By providing the second resistance element in the LC series resonance circuit as a serial component, oscillation that may be caused by the series connection between the inductor and the capacitor can be suppressed. Accordingly, an amplification operation can be stabilized.

A capacitance of the capacitor may vary in accordance with the difference frequency band.

Since the resonant frequency of the LC series resonance circuit can be changed, out-of-band noise can be stably suppressed in response to the changes in a transmission band to be used and a receiving band to be used.

A power amplifier module according to an embodiment of the present disclosure includes a preceding amplifier element configured to amplify a radio-frequency transmission signal and a subsequent amplifier element configured to amplify the radio-frequency transmission signal amplified by the preceding amplifier element. The subsequent amplifier element may include the above-described radio-frequency signal amplifier circuit.

In a power amplifier module in which a plurality of amplifier elements are disposed in multiple stages in accordance with a required specification, it is most important to enhance amplification performance and noise suppression performance of the amplifier element in the last stage in which high power is processed. With the above-described configuration, the subsequent amplifier element includes the radio-frequency signal amplifier circuit having the above-described features. The amplification performance and noise suppression performance of the power amplifier module can be therefore efficiently optimized.

A power amplifier module according to an embodiment of the present disclosure includes a preceding amplifier element configured to amplify a radio-frequency transmission signal, a subsequent amplifier element configured to amplify the radio-frequency transmission signal amplified by the preceding amplifier element, and an amplification control unit configured to control amplification characteristics of the preceding amplifier element and the subsequent amplifier element in accordance with a frequency band of the radio-frequency transmission signal. The preceding amplifier element may include the above-described radio-frequency signal amplifier circuit. The preceding amplifier element and the amplification control unit may be integrated into a first chip.

Since the amplification control unit is integrated into a single chip along with the preceding amplifier element that is less susceptible to the interference of a radio-frequency transmission signal, size reduction can be realized while the quality of a radio-frequency signal is maintained.

At least one of the capacitor and the inductor may be externally attached to the first chip.

The resonant frequency of the LC series resonance circuit is determined by the product of the inductance value of the inductor and the capacitance value of the capacitor. Depending on a set resonant frequency, at least one of the inductance value and the capacitance value becomes large. At least one of the inductor and the capacitor may unable to be included in the first ship because of its size.

With the above-described configuration, the resonant frequency of the LC series resonance circuit can be set regardless of the inductance value and the capacitance value. Accordingly, receiving band noise in a desired difference frequency band can be reduced.

The preceding amplifier element and the subsequent amplifier element may be disposed on a mounting surface of a substrate. At least one of the capacitor and the inductor externally attached to the first chip may be laminated on the first chip to overlap the first chip in plan view of the substrate.

In this case, in addition to the reduction in area realized by the integration of the preceding amplifier element and the amplification control unit into a single chip, a further reduction in area of the power amplifier module can be achieved by laminating the preceding amplifier element and the constituent element in the LC series resonance circuit. Accordingly, further size reduction can be realized while the quality of a radio-frequency signal is maintained.

The first chip may be formed of a complementary metal oxide semiconductor (CMOS).

In a case where the amplification control unit and the preceding amplifier element for which power handling is not needed are formed of the CMOS, the power amplifier module can be manufactured at a lower cost.

The first chip may be made of gallium arsenide (GaAs).

In this case, a radio-frequency transmission signal having high-quality amplification performance and noise suppression performance can be output.

A front-end circuit according to an embodiment of the present disclosure includes the above-described power amplifier module, a transmission filter element, a reception filter element, and a branching filter configured to output a radio-frequency reception signal transmitted from an antenna element to the reception filter element and output a radio-frequency transmission signal, which has been amplified by the power amplifier module and transmitted via the transmission filter element, to the antenna element.

With the above-described configuration, there can be provided a front-end circuit in which the saturated output and power-added efficiency of a radio-frequency transmission signal are improved while out-of-band noise is stably suppressed.

The front-end circuit may further include a variable filter circuit that is disposed between the preceding amplifier element and the subsequent amplifier element and is configured to vary a passband or an attenuation band in accordance with a frequency band of the radio-frequency transmission signal. The passband may be a transmission band corresponding to a communication band used selected from among a plurality of communication bands, and the attenuation band may be a receiving band corresponding to the communication band used.

In this case, a power amplifier module corresponding to a plurality of frequency bands can be configured. Accordingly, there can be provided a multi-band front-end circuit in which the saturated output and power-added efficiency of a radio-frequency transmission signal are improved while out-of-band noise is stably suppressed.

A communication device according to an embodiment of the present disclosure includes the above-described front-end circuit, an RF signal processing circuit configured to output a radio-frequency transmission signal to the front-end circuit and receive a radio-frequency reception signal from the front-end circuit, and a baseband signal processing circuit configured to convert the radio-frequency reception signal input from the RF signal processing circuit into an intermediate-frequency signal, perform signal processing upon the intermediate-frequency signal, and convert the intermediate-frequency signal into a radio-frequency signal, and output the radio-frequency signal to the RF signal processing circuit.

With the above-described configuration, there can be provided a communication device in which the saturated output and power-added efficiency of a radio-frequency transmission signal are improved while out-of-band noise is stably suppressed.

With a radio-frequency signal amplifier circuit according to the present disclosure, a saturated output and conversion efficiency can be improved while out-of-band noise is stably suppressed.

DETAILED DESCRIPTION

Figure 1:
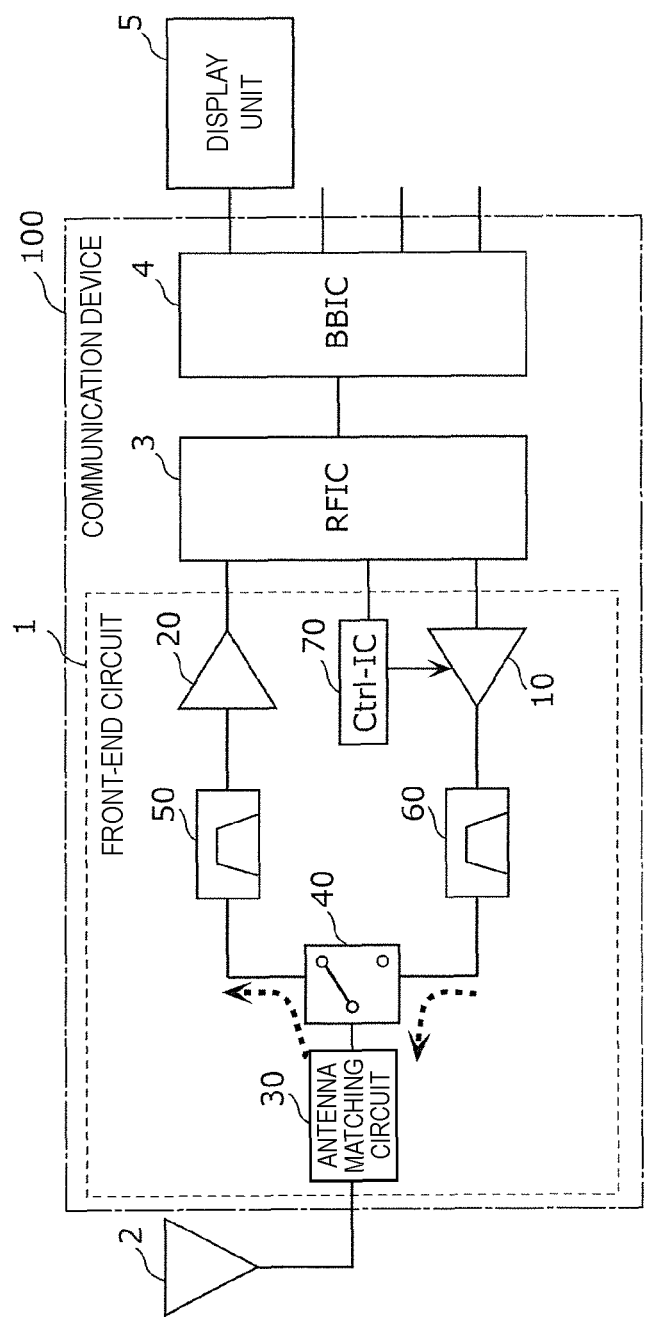
FIG. 1 is a functional block diagram of a communication device according to a first embodiment.

Embodiments of the present disclosure will be described in detail below with reference to the respective embodiments and the drawings thereof. Note that any of the embodiments to be described below represents a general or specific example. Numeric values, shapes, materials, constituents, arrangement of the constituents, connection modes of the constituents, and the like to be described in the following embodiments are merely examples and are not intended to limit the present disclosure. Of the constituents included in the following embodiments, those that are not described in the independent Claims of the present disclosure will be described as optional constituents. Sizes or size ratios of the constituents illustrated in the drawings are not necessarily accurate.

First Embodiment

[1.1 Configuration of Communication Device]

FIG. 1 is a functional block diagram of a communication device 100 according to the first embodiment. In this drawing, the communication device 100, an antenna element 2, and a display unit 5 are illustrated. The communication device 100 includes a front-end circuit 1, an RF signal processing circuit (RFIC) 3, and a baseband signal processing circuit (BBIC) 4. The front-end circuit 1 is disposed in, for example, a front-end portion of a multi-mode/multi-band cellular phone.

The front-end circuit 1 includes a power amplifier (PA) module 10, a low-noise amplifier circuit 20, an antenna matching circuit 30, an antenna switch 40, a reception filter 50, a transmission filter 60, and a control IC 70.

The antenna matching circuit 30 is connected to the antenna element 2 and the antenna switch 40 and performs matching between the antenna element 2 and the front-end circuit 1. As a result of the matching, the front-end circuit 1 can receive a reception signal from the antenna element 2 with low loss and output a transmission signal to the antenna element 2 with low loss. The antenna matching circuit 30 includes one or more radio-frequency circuit components, such as an inductor formed in a chip shape or a pattern and a capacitor formed in a chip shape or a pattern. The antenna matching circuit 30 does not necessarily have to be included in the front-end circuit 1. The antenna matching circuit 30 may be a multi-mode/multi-band variable matching circuit that varies impedance in accordance with a selected band or mode.

The antenna switch 40 is a branching filter configured to switch the connections between the antenna element 2 and a plurality of signal paths by connecting the antenna element 2 (and the antenna matching circuit 30) to either a transmission-side signal path or a reception-side signal path. More specifically, the antenna switch 40 includes a common terminal connected to the antenna matching circuit 30 and two selection terminals connected to the transmission-side signal path or the reception-side signal path.

In FIG. 1, a single pole double throw radio-frequency switch is illustrated as the antenna switch 40. However, in a case where a plurality of transmission-side signal paths and a plurality of reception-side signal paths are provided, the antenna switch 40 is not limited to a 1-input and 2-output type. Instead of the antenna switch 40, a multiplexer including a duplexer or a triplexer configured to separate a transmission wave and a reception wave may be disposed.

The reception filter 50 is a reception filter element that performs filtering upon a reception signal that has been received by the antenna element 2 and transmitted via the antenna switch 40 in a predetermined passband and outputs the filtered signal to the low-noise amplifier circuit 20.

The transmission filter 60 is a transmission filter element that performs filtering upon a transmission signal output from the PA module 10 in a predetermined passband and outputs the filtered signal to the antenna element 2 via the antenna switch 40.

The PA module 10 amplifies a radio-frequency transmission signal output from the RF signal processing circuit 3 and outputs the amplified signal to the antenna switch 40. The PA module 10 is a principal portion of the present disclosure and will be described in detail below.

The low-noise amplifier circuit 20 is a radio-frequency amplifier circuit that amplifies a radio-frequency reception signal output from the antenna switch 40 and outputs the amplified signal to the RF signal processing circuit 3.

The RF signal processing circuit 3 performs signal processing such as down-converting upon a radio-frequency reception signal input from the antenna element 2 via the reception-side signal path and outputs the reception signal that has been subjected to the signal processing to the baseband signal processing circuit 4. The RF signal processing circuit 3 is, for example, a radio frequency integrated circuit (RFIC). The RF signal processing circuit 3 performs signal processing such as up-converting upon a transmission signal input from the baseband signal processing circuit 4 and outputs the radio-frequency transmission signal that has been subjected to the signal processing to the PA module 10.

The baseband signal processing circuit 4 performs signal processing using an intermediate frequency band that is lower in frequency than the radio-frequency signal in the front-end portion. An image signal processed in the baseband signal processing circuit 4 is used for, for example, the display of an image on the display unit 5, and a sound signal processed in the baseband signal processing circuit 4 is used for, for example, a call via a speaker.

The front-end circuit 1 does not necessarily have to include at least one of the reception filter 50 and the transmission filter 60 in accordance with a required specification.

The front-end circuit 1 illustrated in FIG. 1 includes a single transmission-side signal path and a single reception-side signal path but may include a plurality of transmission-side signal paths and a plurality of reception-side signal paths to support multiple bands. In this case, the PA module 10, the low-noise amplifier circuit 20, the reception filter 50, and the transmission filter 60 may be disposed at each of signal paths corresponding to respective frequency bands. The PA module 10, the low-noise amplifier circuit 20, the reception filter 50, and the transmission filter 60 may be configured such that they vary bandpass characteristics and amplification characteristics in accordance with a selected frequency band. In this case, the number of each of these components may be smaller than the number of signal paths.

[1.2 Configuration of PA Module]

Figure 2:
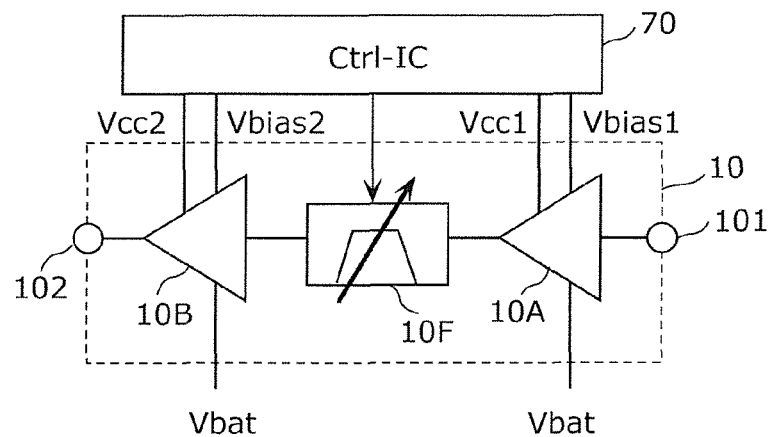
FIG. 2 is a circuit diagram of a PA module according to the first embodiment.

FIG. 2 is a circuit diagram of the PA module 10 according to the first embodiment. In this drawing, a control IC (Ctrl-IC) 70 for controlling the amplification characteristics of the PA module 10 is also illustrated.

The PA module 10 includes a preceding amplifier element 10A, a subsequent amplifier element 10B, and a variable filter circuit 10F.

The preceding amplifier element 10A amplifies a radio-frequency transmission signal input from an input terminal 101. The subsequent amplifier element 10B amplifies the radio-frequency signal amplified by the preceding amplifier element 10A and outputs the amplified signal to an output terminal 102. The input terminal 101 is connected to the RF signal processing circuit 3. The output terminal 102 is connected to the transmission filter 60.

The variable filter circuit 10F is disposed between the preceding amplifier element 10A and the subsequent amplifier element 10B. The passband or attenuation band of the variable filter circuit 10F varies in accordance with the frequency band of a radio-frequency transmission signal or a selected channel. The passband and attenuation band of the variable filter circuit 10F can be varied in accordance with a control signal output from the control IC 70.

The variable filter circuit 10F includes, for example, a switch element and a plurality of filter elements having different passbands and different attenuation bands. The filter elements are typically band pass filters, but may be low-pass filters, high-pass filters, or band elimination filters depending on a frequency allocation relationship among the passbands. Examples of the filter element includes a surface acoustic wave filter, a boundary acoustic wave filter, an acoustic wave filter using a bulk acoustic wave (BAW), and an LC filter including an inductance element and a capacitor element. The number of the filter elements is determined in accordance with the number of bands to be used. At least one or more filter elements may be through-paths. The through-path is a distributed-constant transmission line.

The above-described switch element is disposed, for example, between the preceding amplifier element 10A and the filter elements and switches the connections between the output terminal of the preceding amplifier element 10A and the filter elements. Another switch element may also be disposed between the subsequent amplifier element 10B and the filter elements. The switch element switch the connections between corresponding one of the preceding amplifier element 10A and the subsequent amplifier element 10B and the filter elements in accordance with a control signal supplied from the control IC 70.

The control IC 70 is an amplification control unit configured to control the amplification characteristics of the preceding amplifier element 10A and the subsequent amplifier element 10B in accordance with the frequency band of a radio-frequency transmission signal or a selected channel. The amplification characteristics of the preceding amplifier element 10A and the subsequent amplifier element 10B are, for example, gains (amplification factors) of the preceding amplifier element 10A and the subsequent amplifier element 10B. The control IC 70 controls the switch element in the variable filter circuit 10F in accordance with a control signal that is supplied from the RF signal processing circuit 3 or the baseband signal processing circuit 4 and indicates a communication band (the frequency band of a radio-frequency signal) to be selected and used. More specifically, in a case where the control signal indicates, for example, the selection of a band A, the control IC 70 sets the transmission band of the band A as a passband. The control IC 70 controls the switch element such that the filter element having the receiving band of the band A as an attenuation band is connected to the preceding amplifier element 10A and the subsequent amplifier element 10B.

With the above-described configuration, a radio-frequency transmission signal input from the RF signal processing circuit 3 into the PA module 10 is amplified by the preceding amplifier element 10A. The amplified radio-frequency transmission signal is input into the variable filter circuit 10F. The radio-frequency transmission signal input into the variable filter circuit 10F passes through the filter element that is compliant with the communication method and the communication band. The radio-frequency transmission signal that has passed through the variable filter circuit 10F is further amplified by the subsequent amplifier element 10B and is then output from the PA module 10.

When a radio-frequency transmission signal having a selected frequency band is amplified by the PA module 10, a receiving band component in this frequency band is also amplified by the preceding amplifier element 10A. However, the amplified receiving band component is attenuated to some degree by passing through the filter element selected on the basis of the selected frequency band. Accordingly, the amplified receiving band component can be prevented from entering the low-noise amplifier circuit 20 and being receiving band noise.

With the above-described configuration, the characteristics of the filter, the antenna switch, and the like disposed in the subsequent stage of the RF signal processing circuit 3 and the PA module 10 can be relaxed and the increase in the area of a circuit can be minimized.

[1.3 Configuration of Radio-frequency Signal Amplifier Circuit]

The circuit configuration of the preceding amplifier element 10A according to this embodiment will be described.

Figure 3:
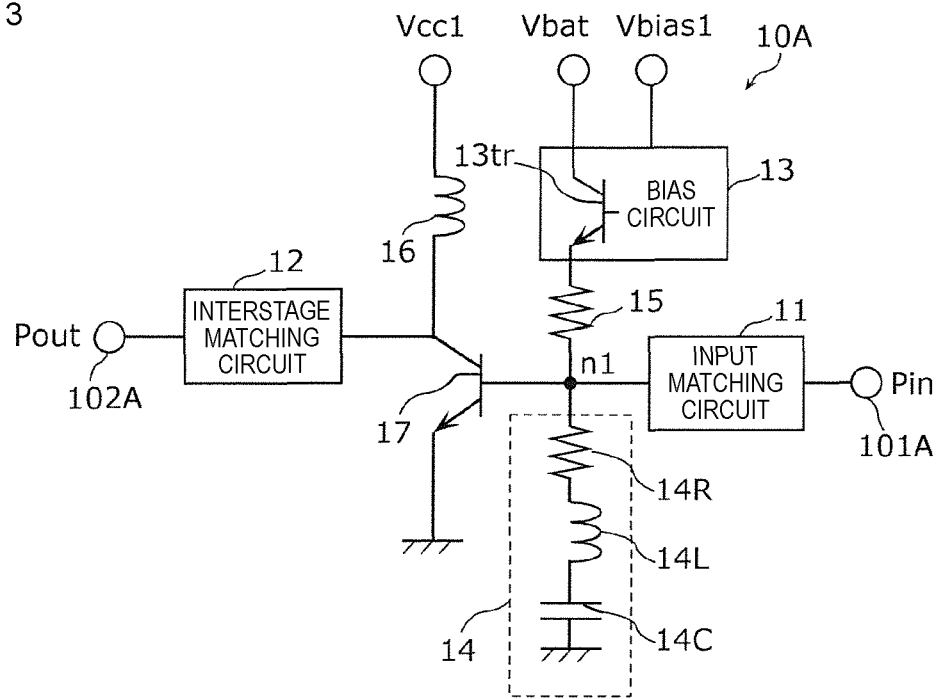
FIG. 3 is a circuit diagram of a radio-frequency signal amplifier circuit according to the first embodiment.

FIG. 3 is a circuit diagram of the preceding amplifier element 10A according to the first embodiment. The preceding amplifier element 10A according to this embodiment includes a radio-frequency signal amplifier circuit illustrated in FIG. 3. The radio-frequency amplifier circuit illustrated in this drawing includes a radio-frequency input terminal 101A, a radio-frequency output terminal 102A, an input matching circuit 11, an interstage matching circuit 12, an amplifier transistor 17, a bias circuit 13, a choke coil 16, an LC series resonance circuit 14, and a resistor 15.

The amplifier transistor 17 amplifies a radio-frequency transmission signal input from the radio-frequency input terminal 101A and is made of, for example, GaAs. Examples of the amplifier transistor 17 include a field effect transistor (FET) and a hetero bipolar transistor (HBT). The base terminal (signal input terminal) of the amplifier transistor 17 is connected to the radio-frequency input terminal 101A via the input matching circuit 11, the collector terminal of the amplifier transistor 17 is connected to a power supply Vcc1 via the choke coil 16, and the emitter terminal of the amplifier transistor 17 is connected to the ground.

The bias circuit 13 includes a DC current supply transistor 13tr and other circuit elements. The bias circuit 13 supplies a DC bias current to the amplifier transistor 17 from the DC current supply transistor 13tr upon receiving a bias power supply Vbat and a reference voltage Vbias1.

The input matching circuit 11 performs impedance matching upon a radio-frequency transmission signal input to the radio-frequency input terminal 101A to suppress the reflection of a radio-frequency signal from the amplifier transistor 17.

The interstage matching circuit 12 performs impedance matching upon a radio-frequency transmission signal amplified by the amplifier transistor 17 to suppress the reflection of a radio-frequency signal from the radio-frequency output terminal 102A. A radio-frequency transmission signal input into the amplifier transistor 17 is amplified by the amplifier transistor 17 and is output to the variable filter circuit 10F via the interstage matching circuit 12 and the radio-frequency output terminal 102A.

The resistor 15 is a first resistance element whose one end is connected to the bias circuit 13 and the other end is connected to the base terminal of the amplifier transistor 17.

One end of the LC series resonance circuit 14 is connected to a node n1 between the resistor 15 and the base terminal of the amplifier transistor 17, and the other end of the LC series resonance circuit 14 is connected to a grounding terminal. The LC series resonance circuit 14 includes an inductor 14L and a capacitor 14C that are connected in series to each other. The LC series resonance circuit 14 further includes a resistor 14R (second resistance element) that is provided between the node n1 and the grounding terminal and is connected in series to the inductor 14L and the capacitor 14C.

A resonant frequency fr of the LC series resonance circuit 14 is specified by Equation 1.

[Math. 1]

$$fr = \frac{1}{2\pi\sqrt{LC}} \quad \text{(Equation 1)}$$

The signal component of the resonant frequency fr specified by Equation 1 flows to the grounding terminal via the LC series resonance circuit 14 and can therefore be removed from an amplification path. The resonant frequency fr is in a difference frequency band $|f_{Tx}-f_{Rx}|$ between a radio-frequency transmission signal Tx and a radio-frequency reception signal Rx in the front-end circuit 1. Here, $f_{Tx}$ represents a center frequency in a transmission band and $f_{Rx}$ represents a center frequency in a receiving band. That is, an inductance value L and a capacitance value C are determined with which the resonant frequency fr and the difference frequency band $|f_{Tx}-f_{Rx}|$ substantially match. As a result, a radio-frequency reception signal component (the frequency $f_{Rx}$) generated by mixing the radio-frequency transmission signal Tx (the frequency $f_{Tx}$) and the difference frequency band component $|f_{Tx}-f_{Rx}|$ in the bias circuit 13 and the amplifier transistor 17 can be suppressed. This leads to the reduction in receiving band noise at the time of the transmission of a radio-frequency transmission signal.

Referring to FIG. 3, the LC series resonance circuit 14 is connected to the node n1 between the resistor 15 and the base terminal of the amplifier transistor 17. It is desirable that the LC series resonance circuit 14 be connected to the base end face of the amplifier transistor 17. Even in a case where the LC series resonance circuit 14 cannot be connected to the base end face of the amplifier transistor 17, it is desirable that the LC series resonance circuit 14 be connected to a position at the node n1 close to the base terminal of the amplifier transistor 17. The reason for this is that the addition of a wiring line, an additional circuit, or a parasitic capacitance between the amplifier transistor 17 and the LC series resonance circuit 14 breaks the parallel connection between the LC series resonance circuit 14 and the base-emitter capacitance of the amplifier transistor 17 and deteriorates a function of reducing the radio-frequency reception signal component (the frequency $f_{Rx}$) generated by mixing the radio-frequency transmission signal Tx and the difference frequency band component $|f_{Tx}-f_{Rx}|$.

To suppress the radio-frequency reception signal component ($f_{Rx}$), the LC series resonance circuit 14 can remove the radio-frequency reception signal component ($f_{Rx}$). However, in a case where the resonant frequency fr is combined with the radio-frequency reception signal component ($f_{Rx}$), the radio-frequency transmission signal component ($f_{Tx}$), which is present in the vicinity of the radio-frequency reception signal component ($f_{Rx}$), also passes through the LC series resonance circuit 14 and is attenuated. From this viewpoint, by combining the resonant frequency fr with the difference frequency band $|f_{Tx}-f_{Rx}|$ that is present in a low-frequency band located sufficiently far away from the radio-frequency reception signal component ($f_{Rx}$) and the radio-frequency transmission signal component ($f_{Tx}$), receiving band noise can be effectively reduced.

Here, examples of actual measurement of receiving band noise of a radio-frequency signal amplifier circuit that is a comparative example and a radio-frequency signal amplifier circuit according to this embodiment will be described. According to the long term evolution (LTE) standard, the output power of a radio-frequency transmission signal output from the antenna element 2 must be greater than or equal to 25 dBm. Assuming that attenuation between the PA module 10 and the antenna element 2 is 3 dB, the output power of the PA module 10 therefore needs to satisfy the value of 28 dBm.

The receiving band noise under the output power condition of the PA module 10 (28 dBm) was measured (1) in a first comparative example in which the LC series resonance circuit 14 was not disposed, (2) in a second comparative example in which the LC series resonance circuit 14 was connected in shunt between the resistor 15 and the bias circuit 13, (3) in the first embodiment in which the LC series resonance circuit 14 to which the resistor 14R is not connected in series is connected in shunt between the resistor 15 and the amplifier transistor 17, and (4) in a second embodiment in which the LC series resonance circuit 14 to which the resistor 14R is connected in series is connected in shunt between the resistor 15 and the amplifier transistor 17. The inductance value of the inductor 14L in the LC series resonance circuit 14 was set to 10 nH, and the capacitance value of the capacitor 14C in the LC series resonance circuit 14 was set to 1000 pF, and the resistance value of the resistor 14R in the LC series resonance circuit 14 was set to 2Ω. The Band 8 (transmission band: 880 MHz-915 MHz, receiving band: 925 MHz-960 MHz) was set as a frequency band to be used. The difference frequency band $|f_{Tx}-f_{Rx}|$ was set to the band of 30-200 MHz. The measurement results are shown in Table 1.

TABLE 1

| | Receiving Band Noise at Pout = 28 dBm (dBm/Hz) |
|---|---|
| First Comparative Example | −129.5 |
| Second Comparative Example | −131.0 |
| First Embodiment | −131.0 |
| Second Embodiment | −131.0 |

As shown in Table 1, in the first comparative example in which the LC series resonance circuit 14 is not disposed, the receiving band noise at the transmission output of 28 dBm is deteriorated as compared with the second comparative example, the first embodiment, and the second embodiment in which the LC series resonance circuit 14 is disposed. In the second comparative example, the first embodiment, and the second embodiment in which the LC series resonance circuit 14 is disposed, the receiving band noise is at the same level regardless of the position of the LC series resonance circuit 14 and the presence of the resistor 14R. That is, the disposition of the LC series resonance circuit 14 improves the receiving band noise.

The optimization of the position of the LC series resonance circuit 14 performed in the first and second embodiments improves a saturated output and power-added efficiency that are indices of performance of the radio-frequency signal amplifier circuit. This will be described below.

The saturated output is the maximum output in a saturated region. The saturated region is a region where a gain in a linear region cannot be kept with the increase in the level of an input to the RF input terminal.

The power-added efficiency is a ratio of a difference between the output power and the input power of the power amplifier to DC power consumption (the product of a Vcc1 voltage and a current flowing from the collector terminal to the emitter terminal).

With the above-described configuration in which the resistor 15 is connected between the base terminal of the amplifier transistor 17 and the bias circuit 13, a radio-frequency transmission signal can be prevented from entering the bias circuit 13 and the occurrence of oscillation at the amplification path connecting the front-end circuit radio-frequency input terminal 101A, the input matching circuit 11, the amplifier transistor 17 and the bias circuit 13 can be prevented. That is, a damping effect can be provided and an amplification operation can therefore be stabilized. The LC series resonance circuit 14 having the function of complementing the phase shift between the current and the voltage is not connected in shunt between the resistor 15 and the bias circuit 13 and is connected in shut between the resistor 15 and the amplifier transistor 17. As a result, a radio-frequency transmission signal for which the adjustment of the phase shift is required can be detected without necessarily being attenuated, while the difference frequency band component $|f_{Tx}-f_{Rx}|$ is removed. The phase shift of the radio-frequency transmission signal can be therefore effectively complemented. A radio-frequency reception signal component generated by mixing the radio-frequency transmission signal Tx (the frequency $f_{Tx}$) and the difference frequency band component $|f_{Tx}-f_{Rx}|$ in the bias circuit 13 and the amplifier transistor 17 can be therefore suppressed to stably suppress out-of-band noise. In addition, the saturated output and power-added efficiency of the radio-frequency transmission signal can be improved.

The improvement of the saturated output and power-added efficiency of the radio-frequency transmission signal which are achieved by a radio-frequency signal amplifier circuit according to this embodiment will be described with reference to FIGS. 4A and 4B.

Figure 4A:
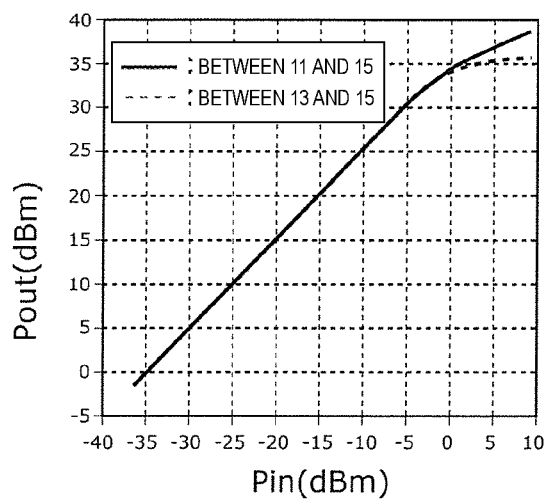
FIG. 4A is a graph illustrating the comparison between the saturated output characteristics of a radio-frequency signal amplifier circuit according to the first embodiment and a radio-frequency signal amplifier circuit that is a comparative example.

FIG. 4A is a graph illustrating the comparison between the saturated output characteristics of a radio-frequency signal amplifier circuit according to the first embodiment and a radio-frequency signal amplifier circuit that is a comparative example. FIG. 4B is a graph illustrating the comparison between the power-added efficiencies between a radio-frequency signal amplifier circuit according to the first embodiment and a radio-frequency signal amplifier circuit that is a comparative example.

The graph illustrated in FIG. 4A indicates a linear relationship between a radio-frequency input signal Pin input into the radio-frequency input terminal 101A of the radio-frequency signal amplifier circuit and a radio-frequency output signal Pout output from the radio-frequency output terminal 102A. As is apparent from this drawing, the linear characteristic (solid line) of a radio-frequency signal amplifier circuit according to the second embodiment in which the LC series resonance circuit 14 is connected in shunt between the input matching circuit 11 and the resistor 15 extends to a higher-power side as compared with the linear characteristic (broken line) of a radio-frequency signal amplifier circuit that is the second embodiment in which the LC series resonance circuit 14 is connected in shunt between the bias circuit 13 and the resistor 15.

Although not illustrated in FIG. 4A, a radio-frequency signal amplifier circuit that is the first comparative example in which the LC series resonance circuit 14 is not disposed also has the linear characteristic represented by the broken line in FIG. 4A. A radio-frequency signal amplifier circuit according to the first embodiment in which the LC series resonance circuit 14 is connected in shut between the input matching circuit 11 and the resistor 15 and the resistor 14R is not connected in series to the LC series resonance circuit 14 has the linear characteristic represented by the solid line in the graph in FIG. 4A.

That is, since the LC series resonance circuit 14 in which the inductor 14L and the capacitor 14C are connected in series is not connected in shunt between the resistor 15 and the bias circuit 13 but is connected in shunt between the resistor 15 and the amplifier transistor 17, the phase shift of a radio-frequency transmission signal can be complemented without necessarily the attenuation of the radio-frequency transmission signal. As a result, the saturated output of the radio-frequency transmission signal is improved.

Figure 4B:
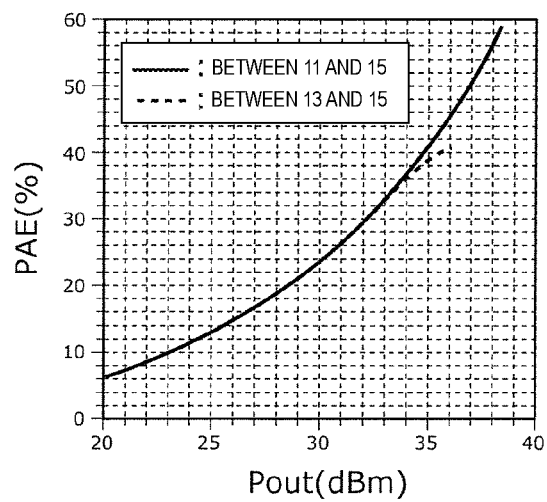
FIG. 4B is a graph illustrating the comparison between the power-added efficiencies between a radio-frequency signal amplifier circuit according to the first embodiment and a radio-frequency signal amplifier circuit that is a comparative example.

FIG. 4B illustrates the relationship between a radio-frequency output signal and power-added efficiency. As is apparent from this drawing, the power-added efficiency (solid line) of a radio-frequency signal amplifier circuit according to the second embodiment in which the LC series resonance circuit 14 is connected in shunt between the input matching circuit 11 and the resistor 15 has larger values on a high power side as compared with the power-added efficiency (broken line) of a radio-frequency signal amplifier circuit that is the second embodiment in which the LC series resonance circuit 14 is connected in shunt between the bias circuit 13 and the resistor 15.

Although not illustrated in FIG. 4B, a radio-frequency signal amplifier circuit that is the first comparative example in which the LC series resonance circuit 14 is not disposed also has the linear characteristic represented by the broken line in FIG. 4B. A radio-frequency signal amplifier circuit according to the first embodiment in which the LC series resonance circuit 14 is connected in shut between the input matching circuit 11 and the resistor 15 and the resistor 14R is not connected in series to the LC series resonance circuit 14 has the linear characteristic represented by the solid line in the graph in FIG. 4B.

That is, since the LC series resonance circuit 14 in which the inductor 14L and the capacitor 14C are connected in series is not connected in shunt between the resistor 15 and the bias circuit 13 but is connected in shunt between the resistor 15 and the amplifier transistor 17, the phase shift of a radio-frequency transmission signal can be complemented without necessarily the attenuation of the radio-frequency transmission signal. As a result, the power-added efficiency of the radio-frequency transmission signal is improved.

In this embodiment, the LC series resonance circuit 14 includes the resistor 14R connected in series to the inductor 14L and the capacitor 14C. However, the resistor 14R does not necessarily have to be provided. Even in a case where a radio-frequency signal amplifier circuit according to this embodiment does not include the resistor 14R, the saturated output and power-added efficiency of a radio-frequency transmission signal can be improved.

Next, the operational effect of the resistor 14R in the LC series resonance circuit 14 will be described with reference to FIGS. 5A and 5B.

Figure 5A:
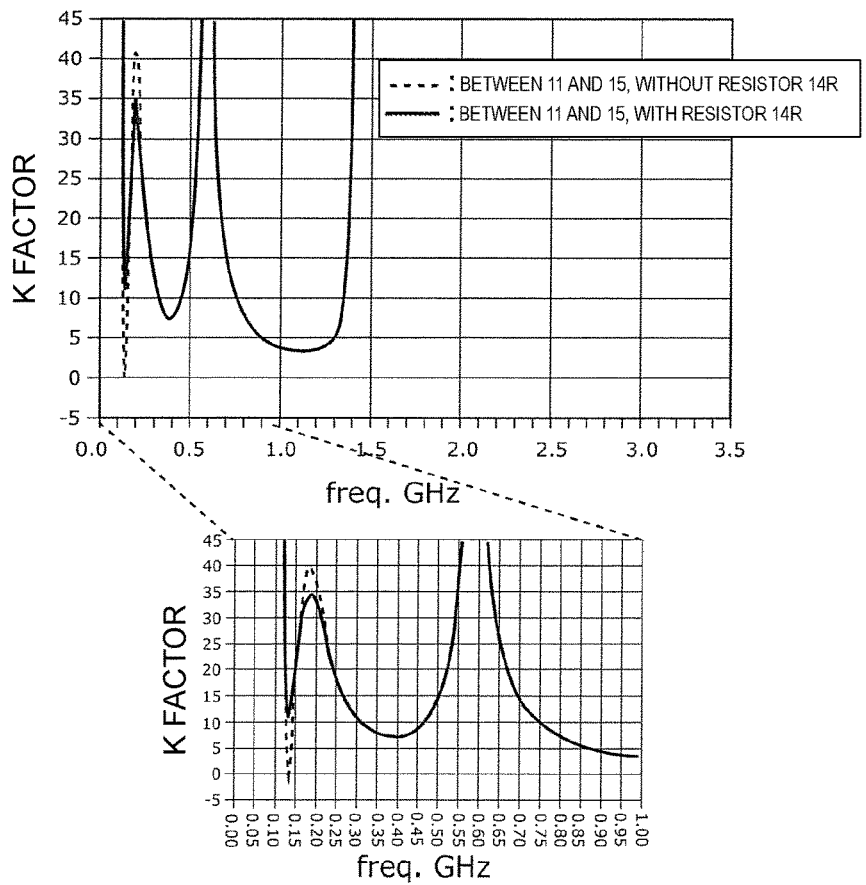
FIG. 5A is a graph illustrating the stabilization index of a radio-frequency signal amplifier circuit according to the first embodiment.
Figure 5B:
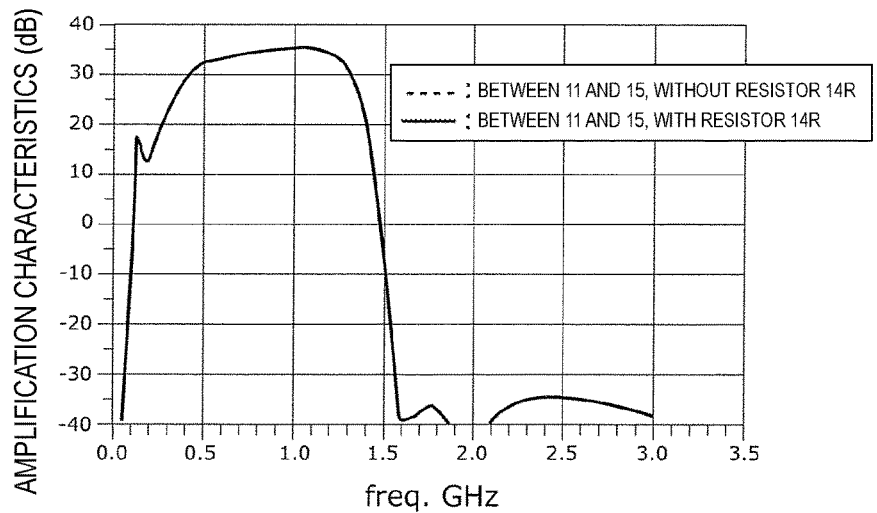
FIG. 5B is a graph illustrating the amplification characteristics of a radio-frequency signal amplifier circuit according to the first embodiment.

FIG. 5A is a graph illustrating the stabilization index of a radio-frequency signal amplifier circuit according to the first embodiment. FIG. 5B is a graph illustrating the amplification characteristics of a radio-frequency signal amplifier circuit according to the first embodiment. FIG. 5A illustrates the frequency dependence of a K factor that is the stabilization index of the LC series resonance circuit 14. FIG. 5B illustrates amplification characteristics between the radio-frequency input terminal 101A and the radio-frequency output terminal 102A in the radio-frequency signal amplifier circuit. As illustrated in FIG. 5B, in both of a case where the resistor 14R is connected in series (solid line) and a case where the resistor 14R is not provided (broken line), there is no difference in amplification characteristics in the passband (–1.5 GHz) of a radio-frequency transmission signal and the attenuation band (the passband of a reception signal: 1.5 GHz–) of the radio-frequency transmission signal.

As is apparent from FIG. 5A, in a case where the resistor 14R is connected in series (solid line), the value of the K factor is greater than or equal to 1 indicating a stable operation in all bands. On the other hand, in a case where the resistor 14R is not provided (broken line), the value of the K factor is less than or equal to 1 in a frequency band (100 MHz to 150 MHz) corresponding to the difference frequency band component $|f_{Tx}-f_{Rx}|$. That is, by providing the resistor 14R as a serial component, the oscillation of the difference frequency band component $|f_{Tx}-f_{Rx}|$ of the LC series resonance circuit 14 is suppressed. This contributes to the stabilization of an amplification operation.

In this embodiment, the capacitor 14C may vary a capacitance value in accordance with the difference frequency band component $|f_{Tx}-|f_{Rx}|$.

Figure 6:
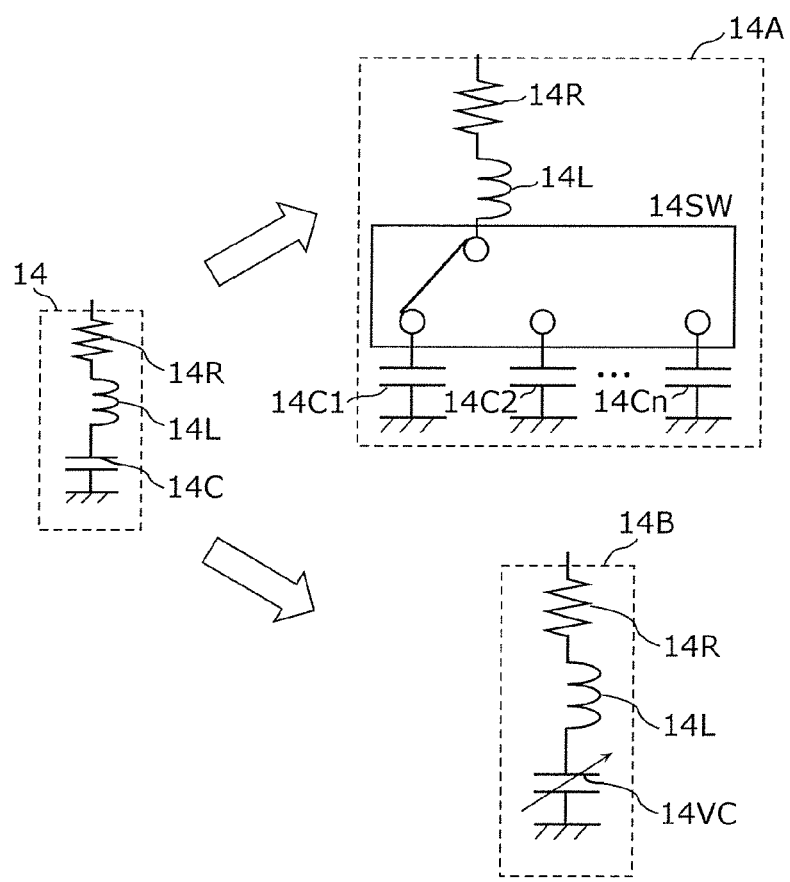
FIG. 6 is a circuit diagram illustrating the modification of an LC series resonance circuit according to the first embodiment.

FIG. 6 is a circuit diagram illustrating the modification of an LC series resonance circuit according to the first embodiment. An LC series resonance circuit 14A illustrated in FIG. 6 is configured to switch the connections to capacitors 14C1, 14C2, . . . , and 14Cn using a switch 14SW. The selective switching between the serial capacitance components of the LC series resonance circuit 14A can therefore be performed.

Not only the switching between capacitors but also the selective switching between LC values including the value of an inductor can also be performed. An LC series resonance circuit 14B can continuously change a capacitance value using a variable capacitor 14VC. As a result, the resonant frequency fr of the LC series resonance circuit 14 can be changed. Accordingly, even in a system whose transmission band and receiving band to be used can be changed, out-of-band noise can be stably suppressed on the basis of a selected transmission band and a selected receiving band.

The subsequent amplifier element 10B may include a radio-frequency amplifier circuit according to this embodiment. In a power amplifier module in which a plurality of amplifier elements are disposed in multiple stages in accordance with a required specification, it is most important to enhance amplification performance and noise suppression performance of the amplifier element in the last stage in which high power is processed. With the above-described configuration, the subsequent amplifier element 10B includes the radio-frequency signal amplifier circuit having the above-described features. The amplification performance and noise suppression performance of the power amplifier module 10 can be therefore efficiently optimized.

The radio-frequency amplifier circuit may be formed of a CMOS. This makes it possible to manufacture the PA module 10 at a lower cost.

Alternatively, the radio-frequency amplifier circuit may be made of GaAs. In this case, a radio-frequency transmission signal having high-quality amplification performance and noise suppression performance can be output.

Second Embodiment

In this embodiment, a configuration will be described in which the positional relationship among the preceding amplifier element 10A formed of a radio-frequency signal amplifier circuit according to the first embodiment, the subsequent amplifier element 10B, and the variable filter circuit 10F is optimized.

In a case where the preceding amplifier element 10A, the subsequent amplifier element 10B, the variable filter circuit 10F, and the control IC 70 are provided in different chips, this configuration cannot contribute to the minimization of the front-end circuit 1. In a case where the preceding amplifier element 10A and the subsequent amplifier element 10B are provided in the same chip for the minimization, the quality of a transmission signal may be deteriorated because of, for example, oscillation caused by strengthened mutual interference between radio-frequency signals.

Figure 7A:
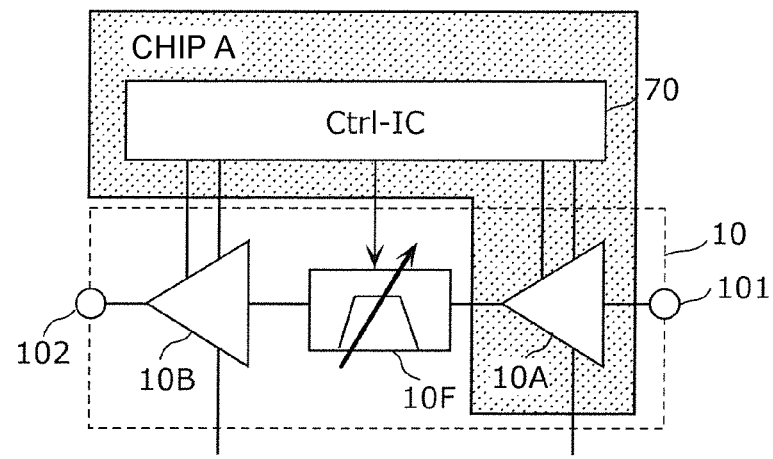
FIG. 7A is a circuit diagram of a PA module according to a second embodiment.

FIG. 7A is a circuit configuration of a PA module according to the second embodiment. As illustrated in FIG. 7A, in the front-end circuit 1 according to this embodiment, the preceding amplifier element 10A and the control IC 70 are integrated into a single ship, a chip A (first chip). The subsequent amplifier element 10B is not included in the chip A.

With the above-described configuration in which the control IC 70 is integrated into a single chip along with the preceding amplifier element 10A that is less susceptible to the interference of a radio-frequency transmission signal, size reduction can be realized while the quality of a radio-frequency signal is maintained. By providing the preceding amplifier element 10A and the subsequent amplifier element 10B in different chips, the mutual interference of radio-frequency signals can be suppressed.

It is desirable that the chip A be formed of a CMOS. In a case where the control IC 70 and the preceding amplifier element 10A for which power handling is not needed are formed of the CMOS, the PA module 10 can be manufactured at a lower cost.

The chip A may be made of GaAs. In this case, a radio-frequency transmission signal having high-quality amplification performance and noise suppression performance can be output.

The switch element included in the variable filter circuit 10F may be included in the chip A. In this case, the front-end circuit 1 can be further miniaturized.

The capacitor 14C included in the LC series resonance circuit 14 is determined in accordance with the resonant frequency fr represented by Equation 1. In a case where the capacitance value of the capacitor 14C is greater than, for example, 20 pF, it is difficult to incorporate the capacitor 14C into the chip A.

Figure 7B:
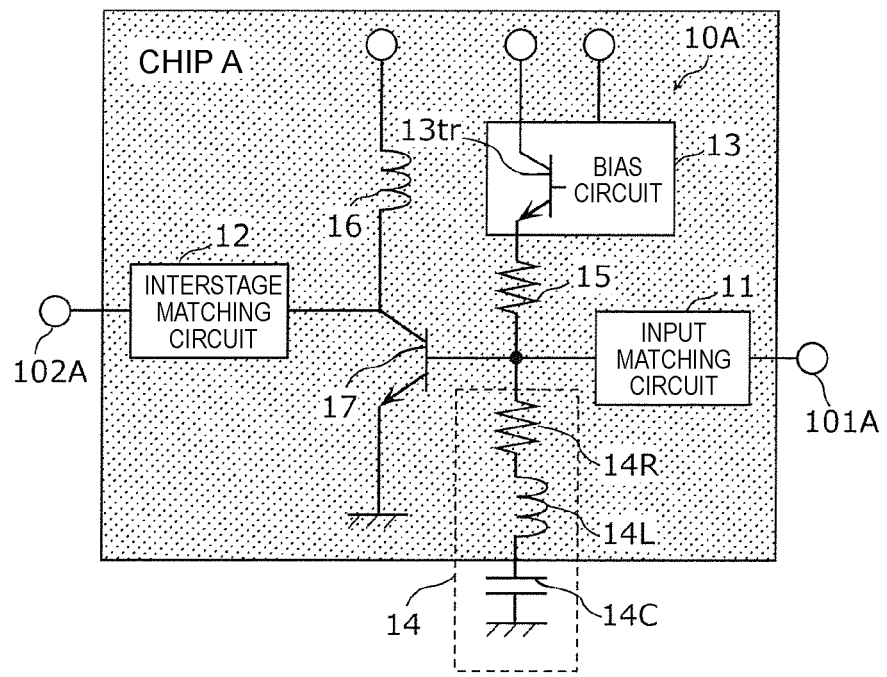
FIG. 7B is a circuit diagram of a radio-frequency signal amplifier circuit according to the second embodiment.

FIG. 7B is a circuit diagram of a radio-frequency signal amplifier circuit according to the second embodiment. This drawing illustrates the configuration of a radio-frequency signal amplifier circuit included in the chip A. As described above, in a case where the capacitance value of the capacitor 14C is greater than a predetermined value, the capacitor 14C may be externally attached to the chip A. In a case where the inductance value of the inductor 14L is greater than a predetermined value like the capacitor 14C, the inductor 14L may be externally attached to the chip A.

With the above-described configuration, the resonant frequency fr of the LC series resonance circuit 14 can be set regardless of an inductance value and a capacitance value. Accordingly, receiving band noise in a desired difference frequency band can be reduced.

Figure 8A:
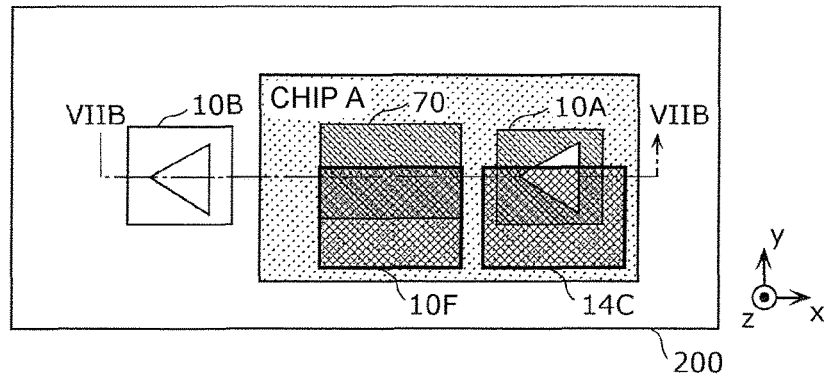
FIG. 8A is a plan view of a PA module according to the second embodiment.
Figure 8B:
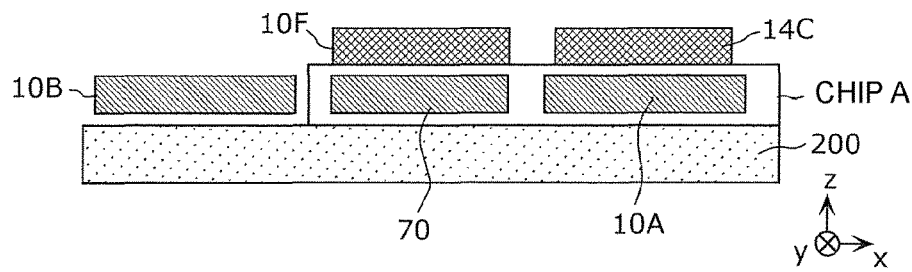
FIG. 8B is a cross-sectional view of a PA module according to the second embodiment.
Figure 9:
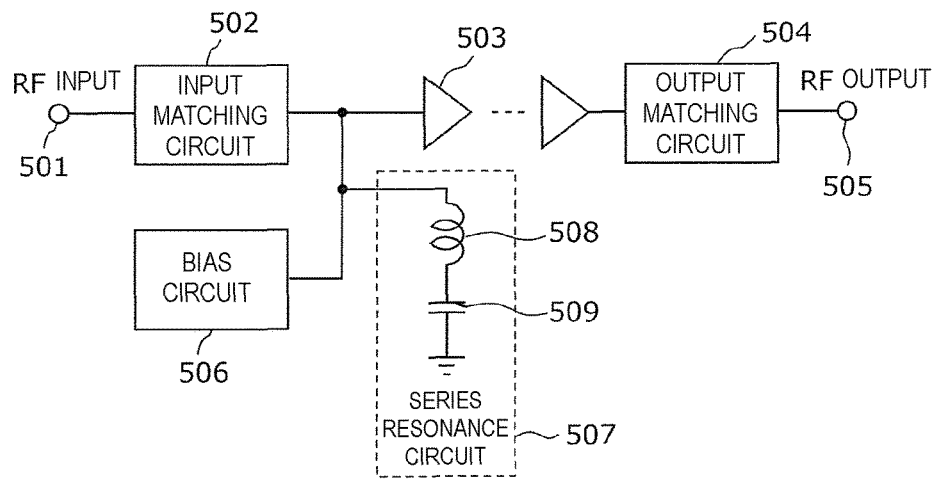
FIG. 9 is a circuit block diagram of a radio-frequency power amplifier disclosed in Patent Document 1.

FIG. 8A is a plan view of the PA module 10 according to the second embodiment. FIG. 8B is a cross-sectional view of the PA module 10 according to the second embodiment. Specifically, FIG. 8B is a cross-sectional view taken along a VIIB-VIIB line in FIG. 8A. As illustrated in FIGS. 8A and 8B, in the PA module 10 according to this embodiment, the preceding amplifier element 10A, the subsequent amplifier element 10B, the control IC 70, the capacitor 14C, and the variable filter circuit 10F are arranged on a substrate 200 (in a z-axis direction in the drawing). The preceding amplifier element 10A and the control IC 70 are integrated into a single chip, the chip A. Each of the capacitor 14C and the variable filter circuit 10F is laminated on the chip A to overlap the chip A. The capacitor 14C externally attached to the chip A is laminated on the chip A to overlap the chip A in plan view of the substrate 200.

With this arrangement, in addition to the reduction in area realized by the integration of the preceding amplifier element 10A and the control IC 70 into a single chip, a further reduction in area of the PA module 10 can be achieved by laminating the preceding amplifier element 10A and the constituent element in the LC series resonance circuit 14. Accordingly, further size reduction can be realized while the quality of a radio-frequency signal is maintained.

Other Embodiments

A radio-frequency signal amplifier circuit, the PA module 10, the front-end circuit 1, and the communication device 100 according to the first and second embodiments have been described. However, a radio-frequency signal amplifier circuit, the PA module 10, the front-end circuit 1, and the communication device 100 according to the present disclosure are not limited to the above-described embodiments.

The present disclosure also includes other embodiments realized by combining optional constituents of the above-described embodiments, modifications obtained by making various changes, which are conceived by those skilled in the art, to above-described embodiments without departing from the spirit and scope of the present disclosure, and various apparatuses including a radio-frequency signal amplifier circuit or the PA module 10 according to the present disclosure.

In a radio-frequency signal amplifier circuit and the PA module 10 according to the above-discussed embodiments, another radio-frequency circuit element and a wiring line may be inserted between each circuit element and a path connecting signal paths illustrated in the drawings.

The variable filter circuit 10F may be a filter circuit configured to attenuate frequency bands other than a channel used in the unused channels of TV and/or IMD noise. With this configuration, in a system that uses unused channels of TV for other communications, the frequency of a channel adjacent to a channel used can be attenuated. The unused channels of TV can be therefore effectively used.

The control IC 70 according to the present disclosure may be realized as an integrated circuit (IC) or a large scale integration (LSI). A method of making an integrated circuit may be realized with a dedicated circuit or a general-purpose processor. A field programmable gate array (FPGA) that can be programmed after LSI manufacturing and a reconfigurable processor capable of reconfiguring the connections and settings of circuit cells inside an LSI may be used. In a case where a new technology for making an integrated circuit is developed with the improvement of a semiconductor technology or by another derivative technology as a technology replacing LSI, the integration of functional blocks may be performed using the new technology.

INDUSTRIAL APPLICABILITY

The present disclosure can be widely applied to communication devices such as a cellular phone as a power amplifier module disposed in a multi-mode/multi-band front-end portion.

REFERENCE SIGNS LIST 1 front-end circuit
2 antenna element
3 RF signal processing circuit
4 baseband signal processing circuit
5 display unit
10 PA module (power amplifier module)
10A preceding amplifier element
10B subsequent amplifier element
10F variable filter circuit
11 and 502 input matching circuit
12 interstage matching circuit
13 and 506 bias circuit
14, 14A, and 14B LC series resonance circuit
14C, 14C1, 14C2, 14Cn, and 509 capacitor
14L and 508 inductor
14R and 15 resistor
14SW switch
14VC variable capacitor
16 choke coil
17 amplifier transistor
20 low-noise amplifier circuit (receiving amplifier circuit)
30 antenna matching circuit
40 antenna switch 50 reception filter
60 transmission filter
70 control IC
100 communication device
101 input terminal
101A radio-frequency input terminal
102 output terminal
102A radio-frequency output terminal
200 substrate
501 RF input terminal
503 radio-frequency signal amplifier transistor
504 output matching circuit
507 series resonance circuit

The invention claimed is:

1. A radio-frequency signal amplifier circuit of a front-end circuit configured to propagate a radio-frequency transmission signal and a radio-frequency reception signal, comprising:
    an amplifier transistor configured to amplify the radio-frequency transmission signal;
    a bias circuit configured to supply a bias signal to an input terminal of the amplifier transistor;
    a first resistance element having a first end connected to the bias circuit and a second end connected to the input terminal of the amplifier transistor; and
    an inductance-capacitance (LC) series resonance circuit having a first end connected to a node between the first resistance element and the input terminal and a second end connected to a ground terminal, the LC series resonant circuit comprising an inductor and a capacitor that are connected in series to each other,
    wherein a resonant frequency of the LC series resonance circuit is in a difference frequency band representing a difference between a frequency band of the radio-frequency transmission signal and a frequency band of the radio-frequency reception signal.

2. The radio-frequency signal amplifier circuit according to claim 1, wherein the LC series resonance circuit further comprises a second resistance element connected in series to the inductor and the capacitor.

3. The radio-frequency signal amplifier circuit according to claim 1, wherein a capacitance of the capacitor varies in accordance with the difference frequency band.

4. A power amplifier module comprising:
    a subsequent amplifier comprising the radio-frequency signal amplifier circuit according claim 1; and
    a preceding amplifier configured to amplify the radio-frequency transmission signal,
    wherein the subsequent amplifier is configured to amplify the radio-frequency transmission signal amplified by the preceding amplifier.

5. A power amplifier module comprising:
    a preceding amplifier comprising the radio-frequency signal amplifier circuit according claim 1, the preceding amplifier being configured to amplify the radio-frequency transmission signal;
    a subsequent amplifier configured to amplify the radio-frequency transmission signal amplified by the preceding amplifier; and
    an amplification controller configured to control amplification characteristics of the preceding amplifier and the subsequent amplifier in accordance with the frequency band of the radio-frequency transmission signal,
    wherein the preceding amplifier and the amplification controller are integrated into a first chip.

6. The power amplifier module according to claim 5, wherein the capacitor or the inductor is externally attached to the first chip.

7. The power amplifier module according to claim 6,
    wherein the preceding amplifier and the subsequent amplifier are disposed on a mounting surface of a substrate, and
    wherein the capacitor or the inductor that is externally attached to the first chip is laminated on the first chip such that at least a portion of the capacitor or the inductor overlaps the first chip when the substrate is viewed in a plan view.

8. The power amplifier module according to claim 5, wherein the first chip is formed of a complementary metal oxide semiconductor (CMOS).

9. The power amplifier module according to claim 5, wherein the first chip is made of gallium arsenide (GaAs).

10. A front-end circuit comprising:
    the power amplifier module according to claim 4;
    a transmission filter;
    a reception filter; and
    a branching filter configured to output the radio-frequency reception signal, transmitted from an antenna, to the reception filter and configured to output the radio-frequency transmission signal, amplified by the power amplifier module and passed through the transmission filter, to the antenna.

11. A front-end circuit comprising:
    the power amplifier module according to claim 5;
    a transmission filter;
    a reception filter; and
    a branching filter configured to output a radio-frequency reception signal transmitted from an antenna to the reception filter and output the radio-frequency transmission signal, amplified by the power amplifier module and passed through the transmission filter, to the antenna.

12. The front-end circuit according to claim 10, further comprising:
    a variable filter circuit that is disposed between the preceding amplifier and the subsequent amplifier, the variable filter circuit being configured to vary a passband or an attenuation band in accordance with the frequency band of the radio-frequency transmission signal,
    wherein the passband is a transmission band, and the attenuation band is a corresponding receiving band.

13. The front-end circuit according to claim 11, further comprising:
    a variable filter circuit that is disposed between the preceding amplifier and the subsequent amplifier, the variable filter circuit being configured to vary a passband or an attenuation band in accordance with the frequency band of the radio-frequency transmission signal,
    wherein the passband is a transmission band, and the attenuation band is a corresponding receiving band.

14. A communication device comprising:
    the front-end circuit according to claim 10;
    a radio-frequency (RF) signal processing circuit configured to output the radio-frequency transmission signal to the front-end circuit and receive the radio-frequency reception signal from the front-end circuit; and
    a baseband signal processing circuit configured to convert the radio-frequency reception signal input from the RF signal processing circuit into a first intermediate-frequency signal and perform signal processing on the intermediate-frequency signal, and configured to convert a second intermediate-frequency signal into a radio-frequency signal, and output the radio-frequency signal to the RF signal processing circuit.

15. A communication device comprising:
the front-end circuit according to claim 11;
an RF signal processing circuit configured to output the radio-frequency transmission signal to the front-end circuit and receive the radio-frequency reception signal from the front-end circuit; and
a baseband signal processing circuit configured to convert the radio-frequency reception signal input from the RF signal processing circuit into a first intermediate-frequency signal and perform signal processing on the intermediate-frequency signal, and configured to convert a second intermediate-frequency signal into a radio-frequency signal, and output the radio-frequency signal to the RF signal processing circuit.

* * * * *

UNITED STATES PATENT AND TRADEMARK OFFICE
CERTIFICATE OF CORRECTION

PATENT NO.         : 10,389,310 B2
APPLICATION NO.    : 16/145430
DATED              : August 20, 2019
INVENTOR(S)        : Reiji Nakajima et al.

Page 1 of 1

It is certified that error appears in the above-identified patent and that said Letters Patent is hereby corrected as shown below:

In the Specification

Column 13, Line 60, "$|f_{Tx}-|f_{Rx}|$" should be -- $|f_{Tx}-f_{Rx}|$ --.

Signed and Sealed this
Nineteenth Day of November, 2019

Andrei Iancu
*Director of the United States Patent and Trademark Office*